(12) United States Patent
Liu et al.

(10) Patent No.: US 9,768,055 B2
(45) Date of Patent: Sep. 19, 2017

(54) ISOLATION REGIONS FOR SOI DEVICES

(75) Inventors: Qing Liu, Guilderland, NY (US);
Nicolas Loubet, Guilderland, NY (US);
Prasanna Khare, Schenectady, NY (US); Shom Ponoth, Gaithersburg, MD (US); Maud Vinet, Rives (FR); Bruce Doris, Slingerlands, NY (US)

(73) Assignees: STMICROELECTRONICS, INC., Coppell, TX (US); INTERNATIONAL BUSINESS MACHINES CORPORATION, Armonk, NY (US); COMMISSASRIAT À L'ÉNERGIE ATOMIQUE ET AUX ÉNERGIES ALTERNATIVES, (CEA), Paris (FR)

( * ) Notice: Subject to any disclaimer, the term of this patent is extended or adjusted under 35 U.S.C. 154(b) by 311 days.

(21) Appl. No.: 13/590,836

(22) Filed: Aug. 21, 2012

(65) Prior Publication Data
US 2014/0054699 A1   Feb. 27, 2014

(51) Int. Cl.
| | | |
|---|---|---|
| H01L 21/76 | (2006.01) | |
| H01L 21/762 | (2006.01) | |
| H01L 29/66 | (2006.01) | |
| H01L 29/786 | (2006.01) | |

(52) U.S. Cl.
CPC .. *H01L 21/76232* (2013.01); *H01L 29/66772* (2013.01); *H01L 29/78654* (2013.01)

(58) Field of Classification Search
CPC ....................................................... H01L 21/76
USPC ........................................................ 257/347
See application file for complete search history.

(56) References Cited

U.S. PATENT DOCUMENTS

| | | | |
|---|---|---|---|
| 6,657,276 B1 * | 12/2003 | Karlsson et al. | 257/510 |
| 6,689,665 B1 | 2/2004 | Jang et al. | |
| 7,994,605 B2 | 8/2011 | Williams | |
| 8,187,975 B1 | 5/2012 | Khare et al. | |
| 9,000,555 B2 | 4/2015 | Liu et al. | |
| 2005/0167778 A1 | 8/2005 | Kim et al. | |
| 2006/0128114 A1 * | 6/2006 | Youn et al. | 438/424 |
| 2006/0214258 A1 | 9/2006 | Kiyotoshi | |
| 2007/0018328 A1 * | 1/2007 | Hierlemann et al. | 257/762 |

(Continued)

FOREIGN PATENT DOCUMENTS

| | | |
|---|---|---|
| CN | 1992194 | 7/2007 |
| CN | 101366112 A | 2/2009 |
| CN | 101366112 A | 6/2016 |

OTHER PUBLICATIONS

U.S. Appl. No. 13/531,654, filed Jun. 25, 2012.
U.S. Appl. No. 13/526,642, filed Jun. 18, 2012.
U.S. Appl. No. 13/221,198, filed Aug. 30, 2012.

*Primary Examiner* — Kenneth Parker
*Assistant Examiner* — Christopher Culbert
(74) *Attorney, Agent, or Firm* — Allen, Dyer, Doppelt & Gilchrist, P.A.

(57) ABSTRACT

An electronic device may include a substrate, a buried oxide (BOX) layer overlying the substrate, at least one semiconductor device overlying the BOX layer, and at least one shallow trench isolation (STI) region in the substrate and adjacent the at least one semiconductor device. The at least one STI region defines a sidewall surface with the substrate and may include an oxide layer lining a bottom portion of the sidewall surface, a nitride layer lining a top portion of the sidewall surface above the bottom portion, and an insulating material within the nitride and oxide layers.

13 Claims, 7 Drawing Sheets

(56) References Cited

U.S. PATENT DOCUMENTS

| | | |
|---|---|---|
| 2007/0132056 A1* | 6/2007 | Williams .......... H01L 21/76232 |
| | | 257/510 |
| 2007/0259500 A1 | 11/2007 | Cheng et al. |
| 2008/0001249 A1 | 1/2008 | Sheen et al. |
| 2008/0166856 A1* | 7/2008 | Parekh et al. ................ 438/435 |
| 2008/0217686 A1* | 9/2008 | Majumdar .......... H01L 29/7848 |
| | | 257/347 |
| 2009/0289279 A1 | 11/2009 | Khare |
| 2010/0255654 A1 | 10/2010 | Lin et al. |
| 2011/0024840 A1* | 2/2011 | Khater .......................... 257/347 |
| 2011/0101488 A1* | 5/2011 | Kim .................. H01L 21/76229 |
| | | 257/506 |
| 2011/0198675 A1 | 8/2011 | Ng et al. |
| 2012/0119296 A1 | 5/2012 | Anderson et al. |
| 2013/0052801 A1 | 2/2013 | Berliner et al. |
| 2013/0334561 A1 | 12/2013 | Lin et al. |
| 2013/0334651 A1 | 12/2013 | Doris et al. |
| 2013/0341754 A1 | 12/2013 | Doris et al. |

\* cited by examiner

ISOLATION REGIONS FOR SOI DEVICES

FIELD OF THE INVENTION

The present invention relates to the field of electronic devices and, more particularly, to semiconductor devices and related methods.

BACKGROUND OF THE INVENTION

Ultra-thin Body and Buried Oxide (BOX) devices (UTBB) are an attractive device structure in that they may allow for improved semiconductor device scaling. UTBB typically includes an ultra-thin Si body as a channel region, which is fully depleted and is beneficial for short channel effect (SCE) control. Also, with thinner BOX (about 25 nm or thinner), compared with ETSOI (extreme thin silicon-on-insulator) devices which have a thicker BOX (more than 50 nm), UTBB provides better scaling capability and the ability to tune threshold voltage (Vt) by applying reasonable back bias.

Shallow trench isolation (STI) regions are typically used in UTBB devices to electrically isolate the semiconductor devices (e.g., field effect transistors (FETs)) from one another. However, with the ultra-thin layers, typical processing operations may cause divots at the interface of the STI regions that can result in shorting from the device source/drain regions to the Si substrate.

Various approaches have generally been used for enhancing STI isolation structures. One such example is set forth in U.S. Pat. Pub. No. 2012/0119296 to Anderson et al., which is directed to trench-generated transistor structures wherein the source and drain of the transistor are defined by doped regions in the semiconductor material of the handle substrate of a semiconductor-on-insulator (SOI) wafer. The gate electrode may be defined from the semiconductor layer of the SOI wafer, which is separated from the handle wafer by an insulating layer.

Despite the existence of such configurations, further enhancements may be desirable for STI regions, particularly where relatively small dimensions are used, such as in UTBB devices.

SUMMARY OF THE INVENTION

In view of the foregoing, it is an object of the invention to provide an electronic device with enhanced interface characteristics between shallow trench isolation (STI) regions and corresponding semiconductor devices.

This and other objects, features, and advantages are provided by an electronic device which may include a substrate, a buried oxide (BOX) layer overlying the substrate, at least one semiconductor device overlying the BOX layer, and at least one shallow trench isolation (STI) region in the substrate and adjacent the at least one semiconductor device. The at least one STI region defines a sidewall surface with the substrate and may include an oxide layer lining a bottom portion of the sidewall surface, a nitride layer lining a top portion of the sidewall surface above the bottom portion, and an insulating material within the nitride and oxide layers. Accordingly, the STI regions(s) may advantageously reduce the likelihood of electrical shorting at an interface between the STI region(s) and the corresponding semiconductor device.

More particularly, the nitride layer may comprise a silicon nitride (SiN) layer, and the oxide layer may comprise a hafnium oxide ($HfO_2$) layer, for example. The nitride layer may extend above the BOX layer, and the oxide layer may terminate below the at least one semiconductor device. Additionally, the insulating material may be different than the nitride and oxide layers. By way of example, the insulating material may comprise silicon dioxide ($SiO_2$).

The at least one semiconductor device may comprise at least one field effect transistor (FET), for example. More particularly, the at least one FET may comprise raised source and drain regions and a channel region therebetween. Furthermore, the at least one STI region may comprise a plurality of STI regions on opposing sides of the at least one semiconductor device.

A method for making an electronic device may include forming at least one STI region in a substrate having a BOX layer overlying the substrate. This may be done by at least forming a trench in the substrate defining a sidewall surface with the substrate, lining a bottom portion of the sidewall surface with an oxide layer, lining a top portion of the sidewall surface above the bottom portion with a nitride layer, and depositing an insulating material within the nitride and oxide layers. The method may further include forming at least one semiconductor device overlying the BOX layer adjacent the at least one STI region.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
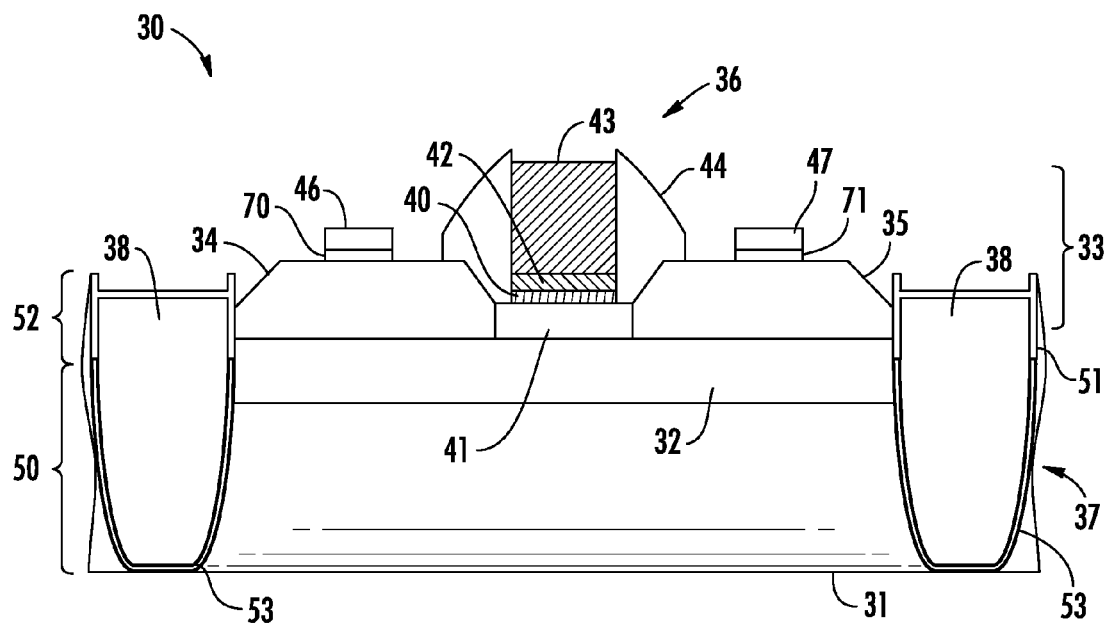
FIG. 1 is a schematic cross-sectional diagram of an electronic device in accordance with the invention including enhanced STI regions.

Referring initially to FIG. 1, an electronic device 30 is first described. In the illustrated example, the electronic device 30 is a UTBB structure which illustratively includes a substrate 31, a buried oxide layer 32 overlying the substrate, and one or more semiconductor devices 33 overlying the BOX layer. In the illustrated example, the substrate 31 is a silicon substrate, although other suitable substrates (e.g., germanium, SiGe, etc.) may also be used in different embodiments. Also, the semiconductor device 33 in the present example is a field effect transistor (FET) including raised source and drain regions 34, 35, and a gate 36. In a typical implementation, a plurality of semiconductor devices 33 (e.g., FETs) may be formed on a UTBB wafer, which are separated from one another by STI regions 37, as will be discussed further below. The raised source and drain regions 34, 35 may be of various types, such as intrinsic silicon, in-situ boron doped SiGe, in-situ phosphorus doped Si/SiC, etc.

The gate 36 illustratively includes a gate insulating layer 40, which overlies a channel layer 41, and a gate electrode 42 overlying the gate insulating layer. A gate contact 43 overlies the gate electrode layer 42. A dielectric sidewall spacer 44 is adjacent the gate contact layer 43 as shown. Respective source and drain silicide regions 70, 71 and contacts 46, 47 are on the raised source and drain regions 34, 35.

By way of background, due to the relatively thin BOX layer 32, UTBB devices may otherwise be susceptible to the HF cleaning used in CMOS device manufacturing. More particularly, the STI regions 37 are filled with an insulator 38, such as silicon dioxide ($SiO_2$), which may be recessed during HF cleaning, etc., creating a divot at the interface of the STI regions and the source/drain regions 34, 35. This can cause shorting from the source/drain regions 34, 35 to the substrate 31. For example, when depositing the silicide regions 70, 71 for the source and drain contacts 46, 47, silicide agglomeration may occur within the divots, which can cause shorting. Another potential cause of shorting is overgrowth of epitaxial silicon in the divots from formation of the raised source and drain regions 34, 35. Still another potential source of shorting may be an over etch/deposition of source/drain contact material for the contacts 46, 47 that carries over into the divots.

One technique that has been attempted to reduce this type of shorting is to form a robust STI liner. A crystallized hafnium oxide ($HfO_2$) STI liner is one material that has been used. This material has a strong resistance to many wet etchants, and also is strong enough to block the dry reactive ion etching (RIE) materials during the contact etch process upon annealing. However, the conventional approach is to deposit a $HfO_2$ liner and then simply fill the STI region 37 with an insulator such as $SiO_2$. Yet, this process may not be not stable, and it may also be too sensitive to subsequent Chemical Mechanical Polishing/Planarization (CMP) steps.

Figure 2:
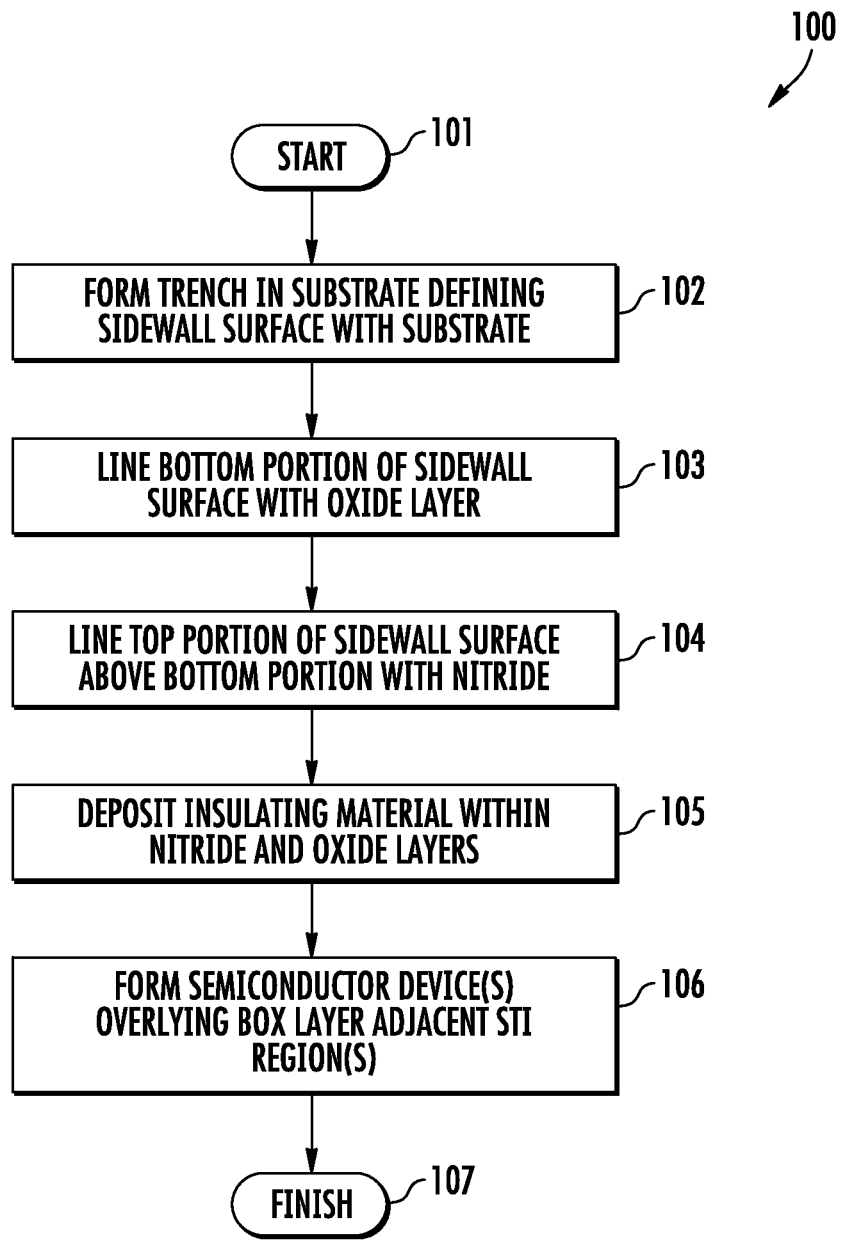
FIG. 2 is a flow diagram illustrating a method for making the electronic device of FIG. 1.

Referring additionally to FIG. 2, an example approach form making the UTBB electronic device 30 is first described. With reference to the flow diagram 100, beginning at Block 101, the method generally includes forming the STI regions 37 by forming a trench 62 (see FIG. 4) in the substrate 32 defining a sidewall surface with the substrate and the BOX layer 32, at Block 102, and lining a bottom portion 50 of the sidewall surface with an oxide layer 53 (e.g., $HfO_2$), at Block 103. The method further illustratively includes lining a top portion 52 of the sidewall surface above the bottom portion 50 with a nitride layer 51 (e.g., SiN), at Block 104, and depositing the insulating material 38 within the nitride and oxide layers, at Block 105. The method further includes forming the semiconductor device(s) 33 overlying the BOX layer 32 adjacent the STI regions 37, at Block 106, which concludes the method illustrated in FIG. 2 (Block 107).

Figure 3:
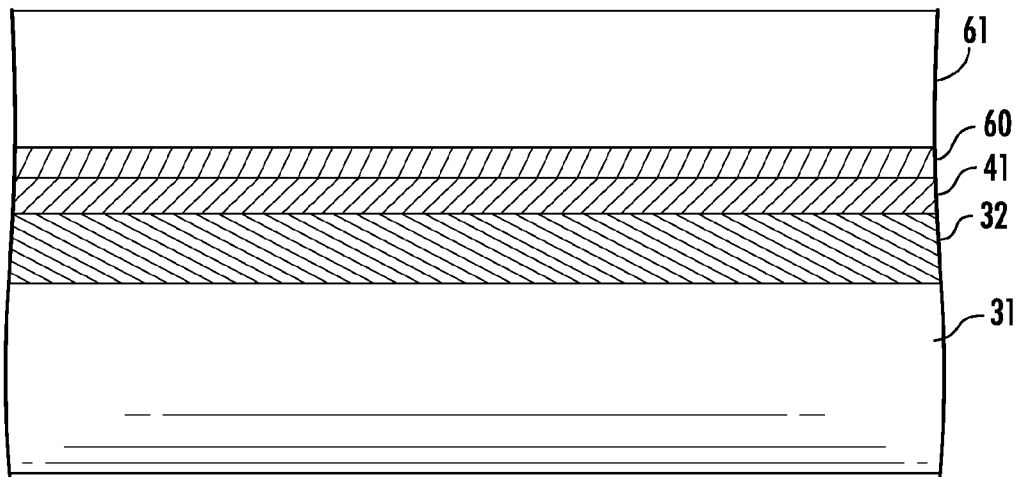
FIGS. 3-10 are a series of schematic cross-sectional diagrams illustrating method steps for making the electronic device of FIG. 1 in greater detail.
Figure 11:
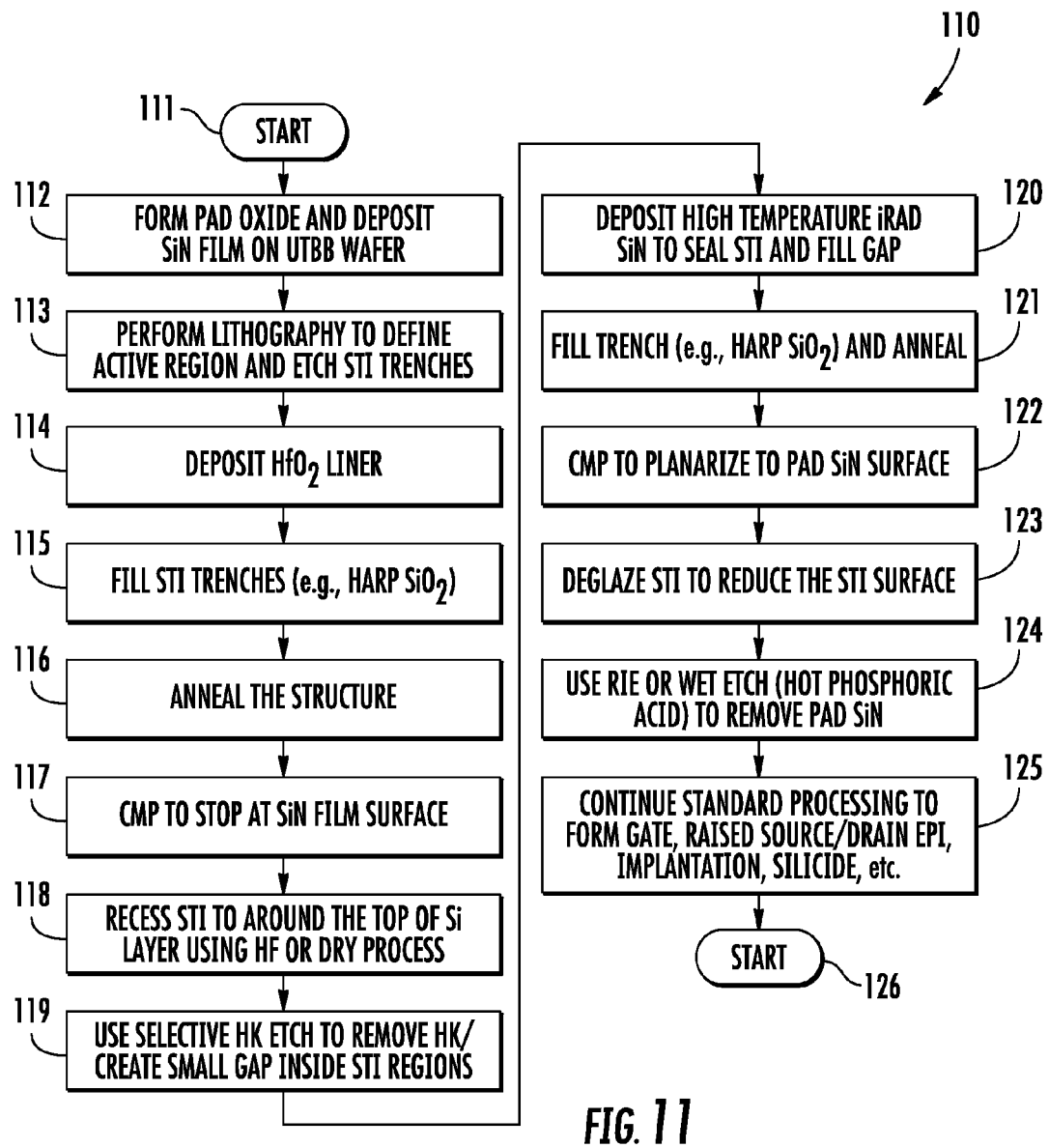
FIG. 11 is a flow diagram which corresponds to the methods steps shown in FIGS. 3-10.

The fabrication process for the electronic device 30 will now be described in further detail with reference to FIGS. 3-8 and the flow diagram 110 of FIG. 11. Beginning at Block 111, the substrate 31, BOX layer 32, and ultra thin silicon layer 41 (which is later patterned to provide the channel) may be provided as a UTBB wafer in some embodiments. A pad oxide layer 60 may be formed overlying the silicon layer 41, and an SiN film 61 is deposited on the SiN film, at Block 112 (FIG. 3). By way of example, the SiN film 61 may have a thickness in a range of about 50 to 80 nm, the pad oxide layer 60 may have a thickness of about 5 nm, and the silicon layer 41 may have a thickness of about 10 nm or less, although other dimensions may be used in different embodiments.

Figure 4:
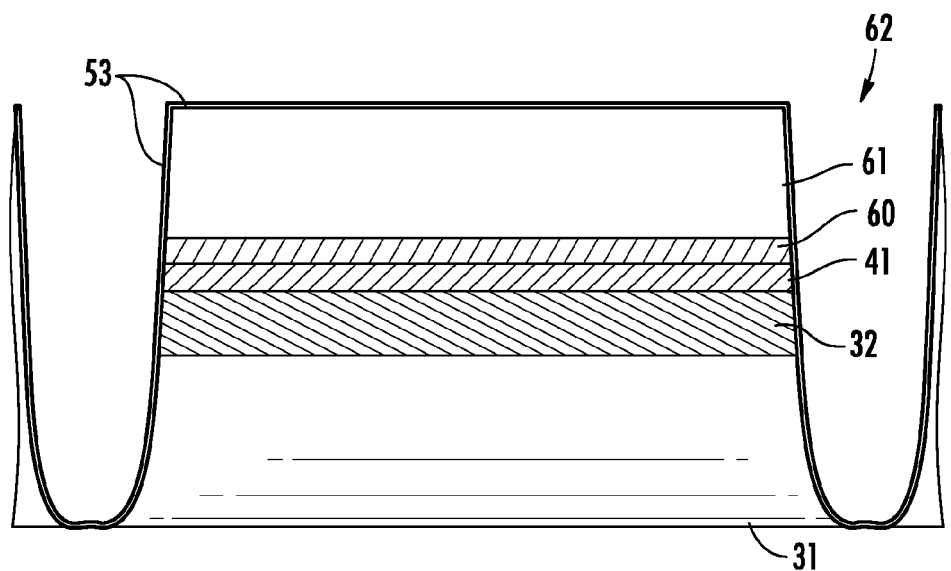
Figure 5:
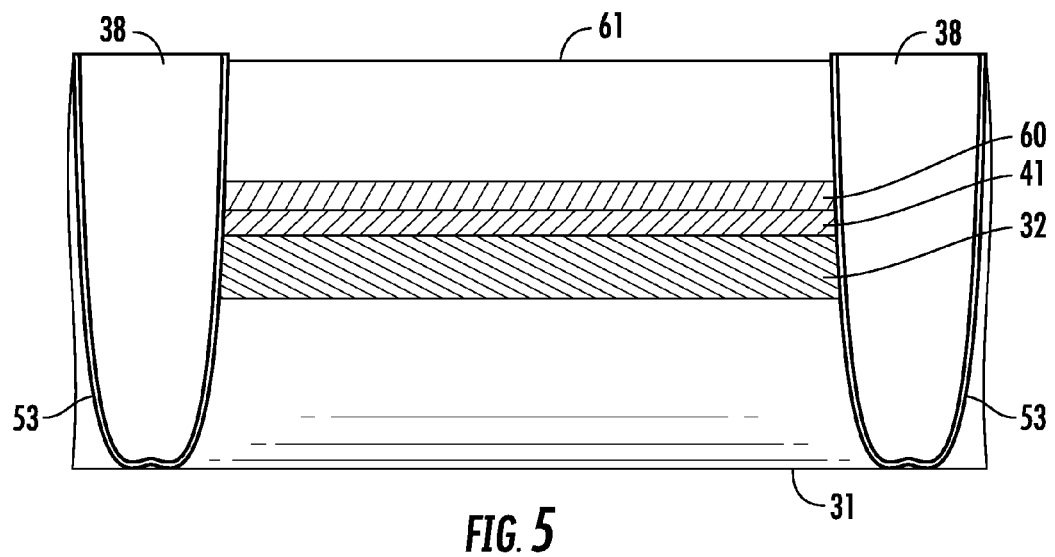

Lithography may then be performed to define and protect an active (RX) region, so that trenches 62 may be etched for the STI regions 37, at Block 113. A $HfO_2$ liner 53 may then be deposited within the trenches 62 and over the SiN film 61, at Block 114 (FIG. 4). The lined trenches 62 are then filled with the insulator 38 (Block 115), e.g., using a High Aspect Ratio Process (HARP) $SiO_2$ deposition, although other suitable insulators may be used in different embodiments. An anneal step is performed, at Block 116, which may be a relatively high temperature anneal (e.g., 1050-1150° C.) for HARP $SiO_2$. At Block 117, a CMP step may be performed to planarize the HARP $SiO_2$ insulator 38 down to the level of the SiN film 61 (FIG. 5).

Figure 6:
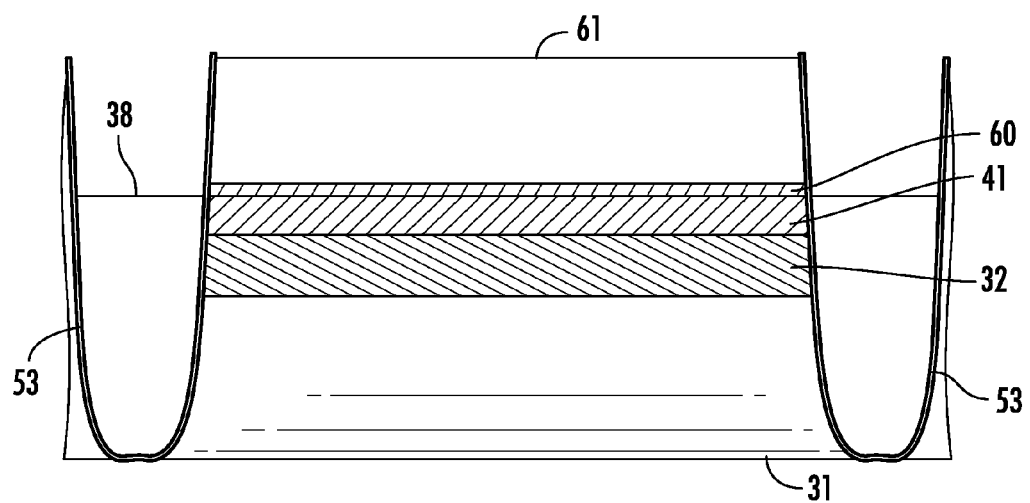
Figure 7:
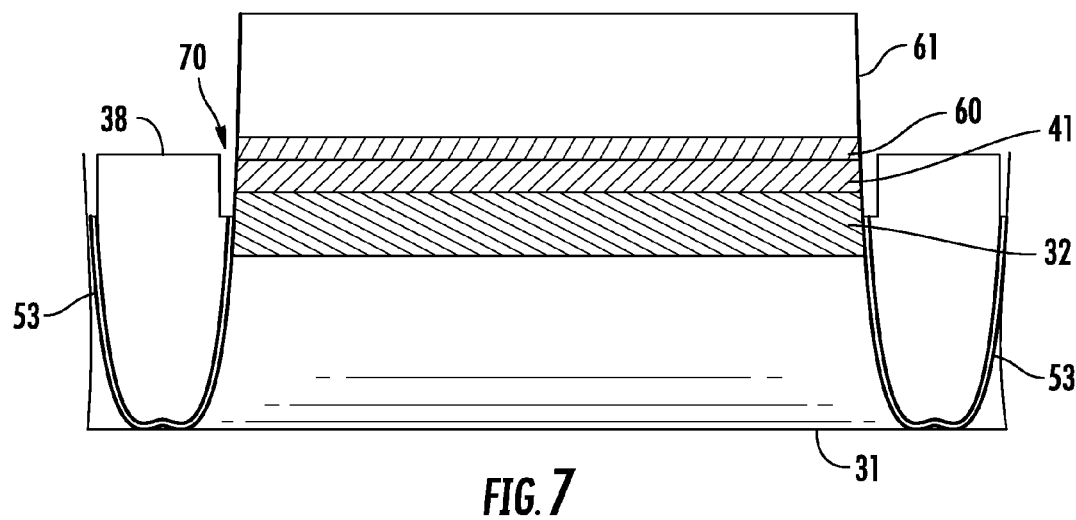

The HARP $SiO_2$ insulator 38 may then be recessed within the $HfO_2$ liner 53 down to a level above the ultra thin Si layer 41, at Block 118 (FIG. 6). A selective HR etch may then be used (Block 119) to remove any HR from the SiN pad film 61, and also create a small gap 70 inside the STI region 37 adjacent the BOX layer 32, Si layer 41, and pad oxide layer 60, as seen in FIG. 7. The bottom of the gap 70 defines the top or termination point for the bottom portion 50 of the STI region 37. In the illustrated example, the bottom of the gap 70 is between the upper and lower surfaces of the BOX layer 32, and may be around the upper half of the BOX layer, for example.

Figure 8:
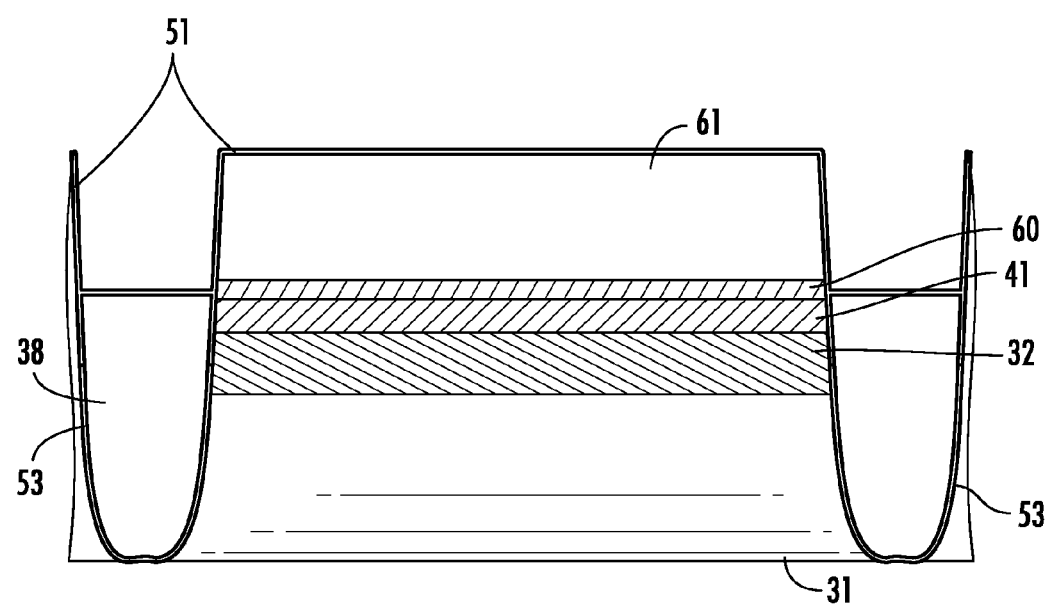
Figure 9:
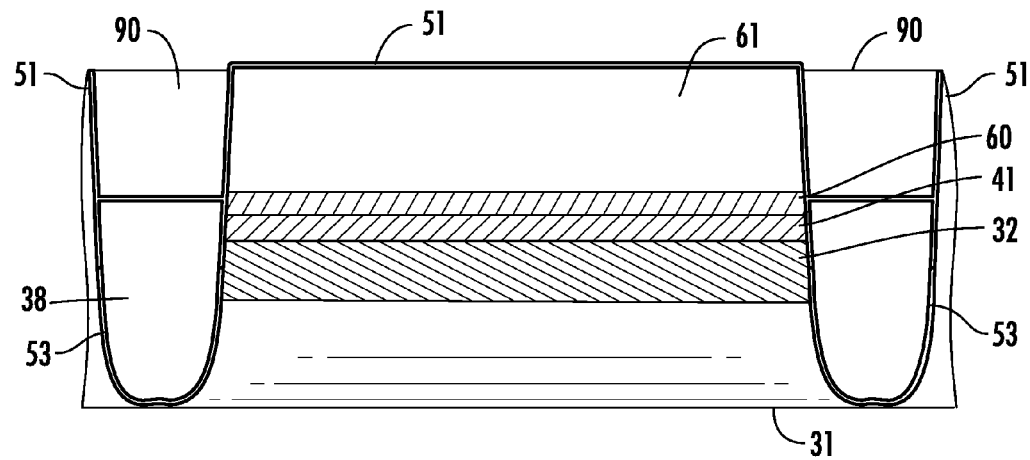
Figure 10:
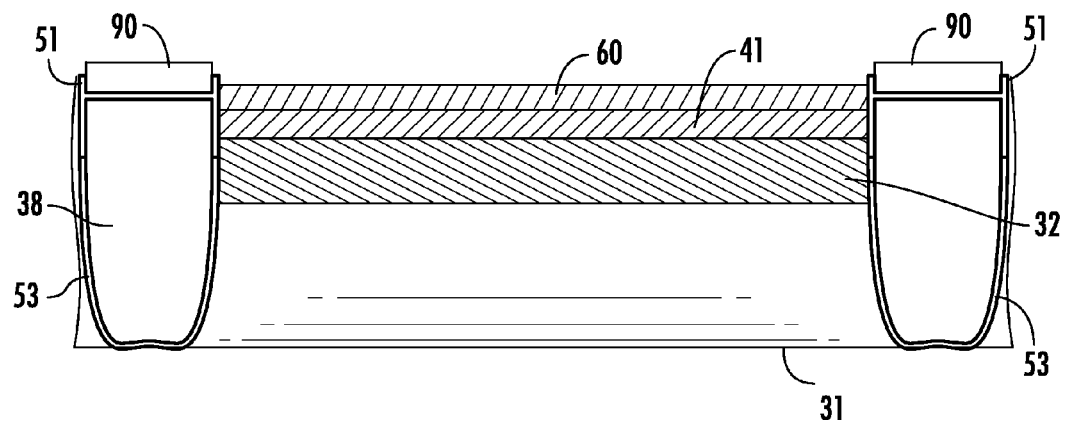

A conformal SiN layer 51 may then be deposited to fill the gap 70 resulting from the HK RIE, and to seal the insulating material 38, at Block 120 (FIG. 8). By way of example, a high temperature iRAD SiN may be deposited, which is very conformal and has very high HF resistivity. The open portion of the trench 62 may again be filled with HARP $SiO_2$ 90 and annealed, at Block 121, as described above, and another CMP step may be performed to planarize down to the SiN layer 51, at Block 122 (FIG. 9). Deglazing may then be performed to reduce the insulator material 90, at Block 123, and a RIB or WET etch (e.g., hot phosphoric acid) may be used to remove the SiN layer 51, at Block 124 (FIG. 10). If a hot phosphoric acid is used, it may be desirable to control the budget to help avoid excessive SiN etch into the liner region. Further conventional processing steps may then be performed to form the gate 36, raised source/drain regions 34, 35, silicide regions 70, 71, and contacts 46, 47, and complete the semiconductor device 33 shown in FIG. 1, at Block 125, which concludes the method illustrated in FIG. 11 (Block 126).

It will therefore be appreciated that as a result of the above-described process, STI consumption by the HF budget is blocked by the SiN liner 51. As such, this approach may allow for a relatively large HF budget to be used to form two or more gate stacks. That is, more HF will typically be required for cleaning where two or more gate stacks are used. Moreover, the strong $HfO_2$ liner 53 advantageously helps prevent source/drain to substrate shorts due to the contact etch process.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electronic device comprising:
   a substrate;
   a buried oxide (BOX) layer overlying the substrate;
   a field effect transistor (FET) overlying the BOX layer and comprising a channel layer on the BOX layer, raised source and drain regions on the BOX layer at opposite ends of the channel layer, and a gate on the channel layer; and
   a shallow trench isolation (STI) region in the substrate, the STI region extending above the BOX layer so that a top portion of the STI region is adjacent to the semiconductor device, the STI region including
      an insulating material,
      an oxide liner in abutting contact with a bottom portion of the insulating material; and
      a nitride liner in abutting contact with a top portion of the insulating material, the nitride liner disposed above the oxide liner and defining a termination point at an interface between the nitride liner and the oxide liner, the termination point located between upper and lower surfaces of the BOX layer, and the nitride liner extending above an uppermost surface of the channel layer.

2. The electronic device of claim 1 wherein the nitride liner comprises a silicon nitride (SiN) layer.

3. The electronic device of claim 1 wherein the oxide liner comprises a hafnium oxide ($HfO_2$) layer.

4. The electronic device of claim 1 wherein said insulating material is different than the nitride and oxide liners.

5. The electronic device of claim 1 wherein said insulating material comprises silicon dioxide ($SiO_2$).

6. The electronic device of claim 1 wherein said STI region comprises a pair of STI regions on opposing ends of said FET.

7. A structure comprising:
   a substrate;
   a buried oxide (BOX) layer overlying said substrate;
   a field effect transistor (FET) overlying the BOX layer and comprising a channel layer on the BOX layer, raised source and drain regions on the BOX layer at opposite ends of the channel layer, and a gate on the channel layer; and
   a shallow trench isolation (STI) region in the substrate, the STI region including
      an insulating material,
      a hafnium oxide ($HfO_2$) layer lining a bottom portion of the insulating material; and
      a silicon nitride (SiN) layer lining a top portion of the insulating material above the $HfO_2$ layer and defining a termination point at an interface between the SiN layer and the $HfO_2$ oxide layer, the termination point located between upper and lower surfaces of the BOX layer, and the SiN layer extending above an uppermost surface of the channel layer.

8. The structure of claim 7 wherein said insulating material is different than the SiN and $HfO_2$ layers.

9. An electronic device comprising:
   a substrate;
   a buried oxide (BOX) layer overlying said substrate;
   a field effect transistor (FET) overlying said BOX layer and comprising a channel layer on the BOX layer, raised source and drain regions on the BOX layer at opposite ends of the channel layer, and a gate on the channel layer; and
   a plurality of shallow trench isolation (STI) regions in the substrate and on opposing sides of the FET, said plurality of STI regions each defining a respective sidewall surface with the substrate and each comprising
      an insulating material,
      an oxide layer lining a bottom portion of the insulating material,
      a nitride layer lining a top portion of the insulating material above the oxide layer and extending above an uppermost surface of the channel layer.

10. The electronic device of claim 9 wherein said nitride layer comprises a silicon nitride (SiN) layer.

11. The electronic device of claim 9 wherein said oxide layer comprises a hafnium oxide ($HfO_2$) layer.

12. The electronic device of claim 9 wherein said oxide layer terminates below said FET.

13. The electronic device of claim 9 wherein said insulating material comprises silicon dioxide ($SiO_2$).

* * * * *